(12) United States Patent  (10) Patent No.: US 6,657,502 B2
Bushman et al.  (45) Date of Patent: Dec. 2, 2003

(54) MULTIPHASE VOLTAGE CONTROLLED OSCILLATOR

(75) Inventors: Michael L. Bushman, Hanover Park, IL (US); Lawrence E. Connell, Hanover Park, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/968,171

(22) Filed: Oct. 1, 2001

(65) Prior Publication Data

US 2003/0062960 A1 Apr. 3, 2003

(51) Int. Cl.[7] .............................. H03B 27/00; H03B 5/24
(52) U.S. Cl. .......................... 331/57; 331/45; 331/135; 331/175
(58) Field of Search ....................... 331/57, 177 R, 331/175, 135, 45

(56) References Cited

U.S. PATENT DOCUMENTS

| 5,602,514 A | * | 2/1997 | Monk et al. | .................. 331/57 |
| 5,841,325 A | * | 11/1998 | Knotts et al. | ............ 331/177 R |
| 6,191,658 B1 | * | 2/2001 | Fairbanks | ............... 331/177 R |

* cited by examiner

*Primary Examiner*—Arnold Kinkead
(74) *Attorney, Agent, or Firm*—Heather L. Mansfield

(57) ABSTRACT

A multiphase voltage controlled oscillator (e.g., a quadrature VCO) 100, which includes multiple voltage controllable transconductance phase drivers 102, 104, 106 and 108. The output of each voltage controllable transconductance phase driver 102, 104, 106, 108 supplies one of 4 oscillator phases and receives 2 of the 4 phases as inputs. Each of the voltage controllable transconductance phase drivers 102, 104, 106 and 108 corresponds to a pair of controllable transconductance inverting amplifiers 132, 134, 136, 138. The controllable transconductance inverting amplifiers may be a simple inverter 150 that includes N-type FET (NFET) 152 and P-type FET (PFET) 154. Transconductance is controlled in the simple inverter by raising or lowering supply voltage ($V_{dd}$) levels. A more complex controllable transconductance inverting amplifier may be used, replacing PFET 154 with series connected PFETs 164, 166. The gate of one PFET 166 is controlled by a bias control voltage $V_{CON}$. For additional sensitivity and control PFETs 164, 166 may each be replaced with parallel pairs of PFETs 174, 176 and 178, 180. In addition to a quadrature VCO, an N phase oscillator may be formed with each phase generated by a controllable transconductance functional block, appropriately selecting block inputs from output phases.

18 Claims, 4 Drawing Sheets

MULTIPHASE VOLTAGE CONTROLLED OSCILLATOR

BACKGROUND OF THE INVENTION

1. Field of the Invention

The present invention is related to voltage controlled oscillators and, more particularly to a quadrature voltage controlled oscillator formed on an integrated circuit chip.

2. Background Description

Voltage Controlled Oscillators (VCOs) are well known. A typical prior art VCO is a tunable tank circuit, i.e., an inductor (L) in parallel with a capacitor (C) driving a buffer, e.g., an inverter, that oscillates at a base frequency ($T_0$) and has a voltage tunable operating range. Ideally, the VCO output frequency is directly and linearly proportional to a control voltage applied to the oscillator. Oscillator operating frequency may be varied by varying L or C. Generally, tunable tank circuit VCOs are the most reliable VCOs.

Completely integrated LC tank VCO's typically require band switching techniques or even multiple VCO's to achieve very wide tuning ranges. Discrete components, such as inductors and capacitors, are expensive and bulky. Further, attaching these discrete components to an integrated circuit complicates the integrated circuit. Accordingly, typical integrated circuit chip VCOs are based on simple oscillators or other circuits that may be built and contained on-chip, e.g., ring oscillators. However, ring oscillators are not particularly stable and are very sensitive to chip ambient and operating conditions.

Further, the output voltage swing of such ring oscillator based integrated VCOs is not constant but, is linearly related to output frequency. In order to achieve a large tuning range, the designer must accept small output signals at the low frequency end of the VCO operating spectrum. These low output signal levels degrade oscillator performance and increase noise sensitivity.

Thus, there is a need for a fully integrated quadrature VCO with a large tuning range and a large output signal level throughout the tuning range.

BRIEF DESCRIPTION OF THE DRAWINGS

The foregoing and other objects, aspects and advantages will be better understood from the following detailed preferred embodiment description with reference to the drawings, in which.

DESCRIPTION OF A PREFERRED EMBODIMENT

The present invention is a multiphase Voltage Controlled Oscillator (VCO) that does not include an inductor, preferably of the type known as a quadrature VCO, which is fully integratable onto a single integrated circuit chip. In particular, the quadrature VCO of the present invention may be implemented in the complementary insulated gate field effect transistor (FET) technology that is commonly referred to as CMOS. A quadrature VCO typically produces at least two output signals 90 degrees out of phase with each other, i.e. a sine phase and a cosine phase.

Thus, the VCO of present invention is a low noise, wide frequency range, fully integratable CMOS quadrature VCO with a large output voltage swing over the full frequency range. The preferred tuning range for the VCO extends from 1200 MHz to 2000 MHz and the output voltage swing is sufficiently large over the entire range to drive digital circuits. In addition the VCO includes dual tuning ports to support a unique synthesizer loop.

Figure 1:
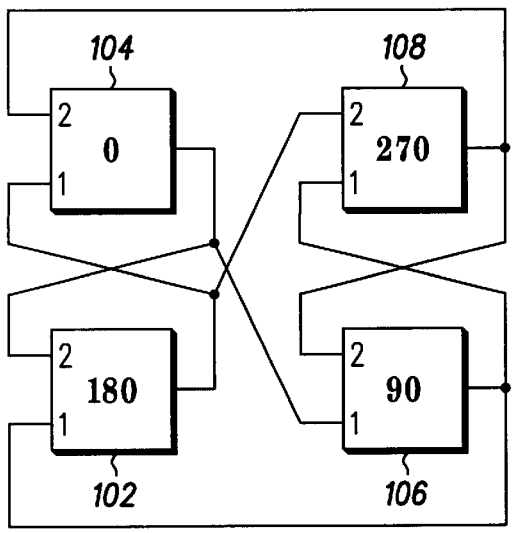
FIG. 1 shows a functional block diagram of the preferred embodiment quadrature VCO.

FIG. 1 shows a block diagram of the preferred embodiment quadrature VCO 100, which includes voltage controllable transconductance phase drivers 102, 104, 106 and 108. In this embodiment, the output of each voltage controllable transconductance phase driver 102, 104, 106, 108 supplies one of 4 oscillator phases. Each voltage controllable transconductance phase driver 102, 104, 106, 108 receives 2 of the 4 phases as block inputs. The present invention is not restricted in use as a quadrature VCO, but may be used to implement an oscillator with N phases, each phase generated by a controllable transconductance functional block, appropriately selecting block inputs from output phases as described hereinbelow.

Figure 2:
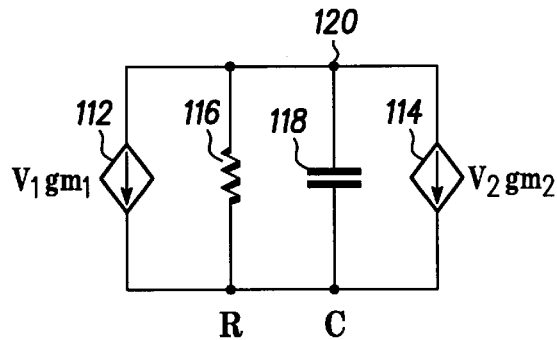
FIG. 2 shows the basic structure of the voltage controllable transconductance phase drivers used for constructing the VCO in FIG. 1.

FIG. 2 shows the basic phase driver 110 for constructing a VCO 100 corresponding to the voltage controllable transconductance phase drivers 102, 104, 106 and 108 in FIG. 1. Each basic phase driver 110 includes dual transconductance inverting amplifiers 112, 114. Resistor 116 and capacitor 118 form a single pole and phase shifting impedance at the current summing output node 120. Transconductance amplifiers 112, 114 generate currents $V_1 gm_1$, $V_2 gm_2$ in response to input control voltages $V_1$, $V_2$.

Figure 3A:
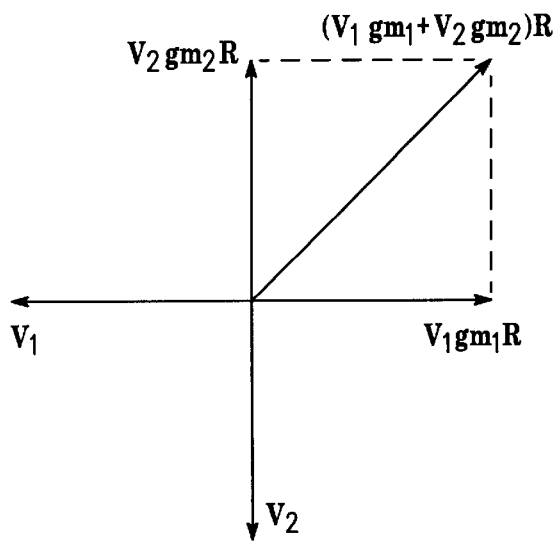
FIGS. 3A–B show the relationship of input vectors $V_1$ and $V_2$ provided to transconductance amplifiers to the resulting current vectors $V_1 gm_1$ and $V_2 gm_2$ at the current summing output node.
Figure 3B:
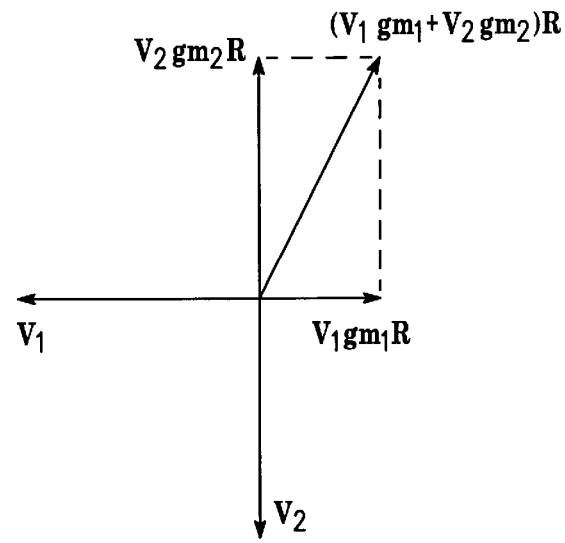

As can be seen from FIGS. 3A–B, the input voltages $V_1$ and $V_2$ provided to transconductance amplifiers 112, 114 can be considered as vectors with phase and magnitude. Current vectors $V_1 gm_1$ and $V_2 gm_2$ result therefrom and are summed at the current summing node 120, which is the phase driver output. For simplicity, taking the capacitor 118 to be zero and, therefore, $X_c=4$, the current vectors sum in the output impedance (R), resulting in the output voltage vector $(V_1 gm_1 + V_2 gm_2)R$. As shown in FIG. 3A, if the input voltage vectors are of equal amplitude and are in quadrature, then, the resultant output voltage vector is 45 degrees out of quadrature and inverted. In addition, as shown in FIG. 3B, both the magnitude and the phase of the output vector can be controllably varied by controlling the transconductance amplifier gain $gm_1$ and $gm_2$.

Figure 4A:
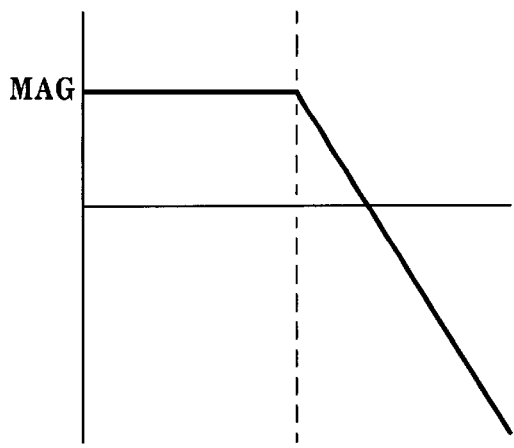
FIGS. 4A–B show Bode plots of the magnitude and phase components of the single pole summing the impedance.
Figure 4B:
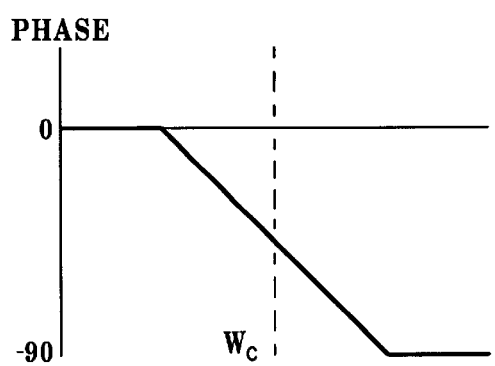
Figure 4C:
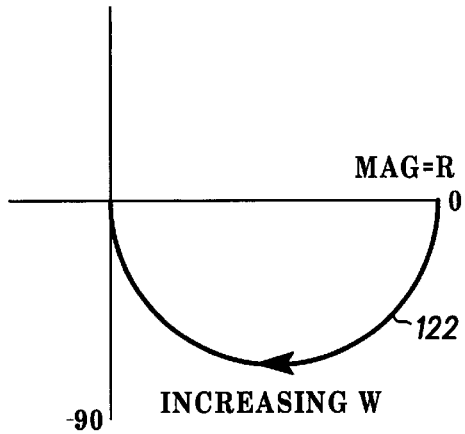
FIG. 4C shows the transfer function of the summing impedance in polar coordinates for an individual voltage controllable transconductance phase driver.

FIGS. 4A–B show the magnitude and phase, respectively, of single pole summing impedance in polar form. Phase shift is zero (0) at zero (0) radians and approaches negative ninety degrees (−90°) or −B/2 radians as the frequency approaches infinity. The magnitude is maximum and equal to R at 0 radians and falls to 0 as frequency increases towards infinity. The 3 db point occurs at T=1/RC, which also corresponds to a 45 degree phase shift. FIG. 4C shows the transfer function of the summing impedance (including the capacitor 118) in polar coordinates for an individual controllable transconductance functional block. The vector impedance at any frequency originates at the origin and terminates on the arc 122 at a point corresponding to that particular frequency.

Figure 5A:
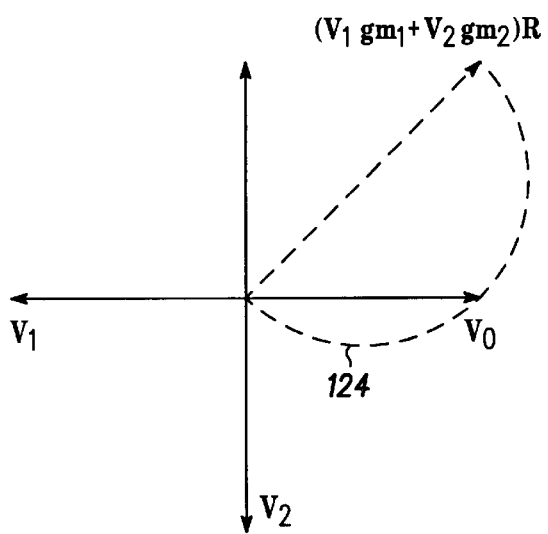
FIGS. 5A–B show the vector transfer function for the voltage controllable transconductance phase driver that is obtained by overlaying the summing impedance polar graph of FIG. 4C onto the phasor diagram of FIGS. 3A–B.
Figure 5B:
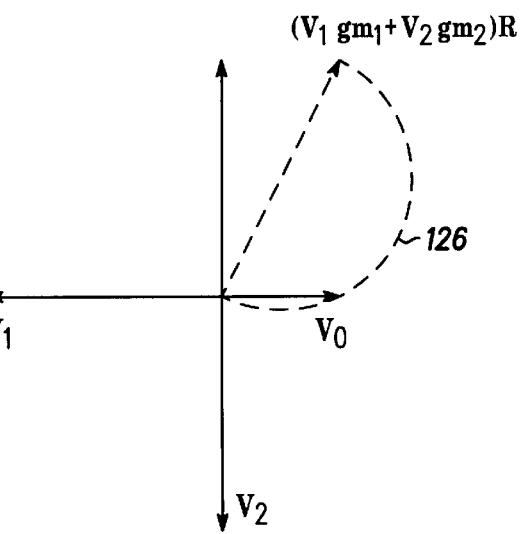

FIGS. 5A–B show the vector transfer function for the voltage controllable transconductance phase drivers 102, 104, 106, 108 that is obtained by overlaying the summing impedance polar graph of FIG. 4C onto the phasor diagram of FIGS. 3A–B. The phase shift vector at 0° for the summing impedance is mapped to the magnitude and phase of the output voltage vector ($V_1 gm_1 + V_2 gm_2$)R with arcs 124, 126 corresponding to arc 122. For any specific combination of quadrature input vectors and values of $gm_1$ and $gm_2$, there exists a unique frequency on the polar graph of the summing impedance that corresponds to a quadrature output vector. So, as indicated above for $gm_1 = gm_2$, the quadrature output vector corresponds to 45 degree phase shift at $T_C = 1/RC$ as in FIG. 5A. Thus, by controlling the values of $gm_1$ and $gm_2$ the quadrature frequency of the phase drivers is controlled, and the quadrature frequency may be varied from 0 to infinity. So, for each phase driver 102, 104, 106, 108 in the example of FIG. 1, the input vector $V_1$ is 180 degrees out of phase and the input $V_2$ is −90 degrees out of phase with the resulting output vector. From this analysis, it is a simple matter to select which block output signals are passed to which block input.

Figure 6:
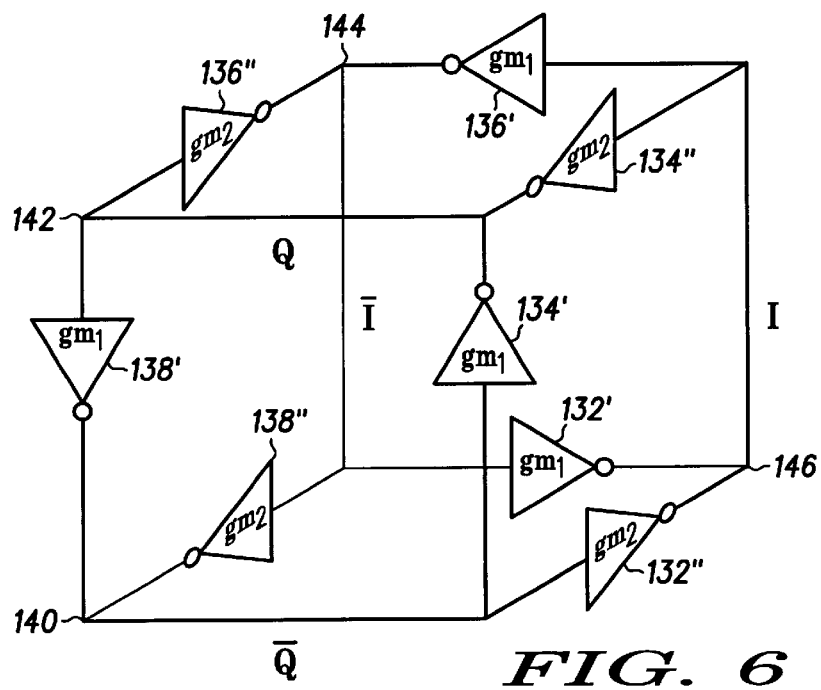
FIG. 6 is a block diagram in further detail of a preferred embodiment quadrature VCO.

FIG. 6 is a block diagram of a preferred embodiment quadrature VCO 130 corresponding to and in further detail of the block diagram 100 of FIG. 1. Each of the voltage controllable transconductance phase drivers 102, 104, 106 and 108 corresponds to a pair of controllable transconductance inverting amplifiers 132, 134, 136 and 138 respectively. Further, each of the pairs of controllable transconductance inverting amplifiers 132', 132'', 134', 134'', 136', 136'' and 138', 138'', corresponds to one of the pair of inverting transconductance amplifiers 112, 114 of FIG. 2, the subscript indicating correspondence. Thus, each pair 132, 134, 136, 138 provides a respective current and phase which is summed at the respective individual output 140, 142, 144 or 146 as described hereinabove for FIG. 2.

Figure 7A:
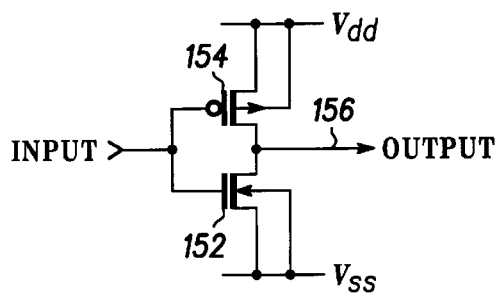
FIGS. 7A–C are examples of voltage controllable transconductance inverters.
Figure 7B:
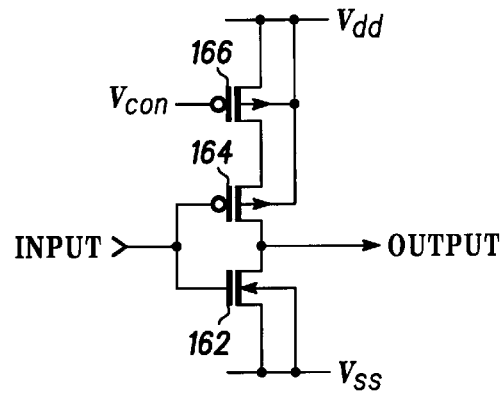
Figure 7C:
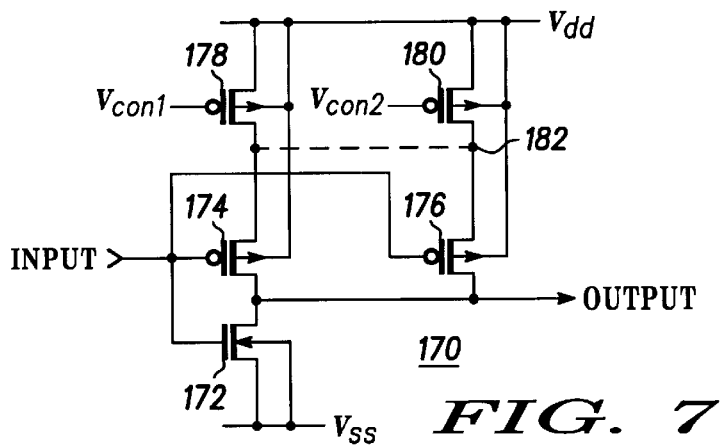

FIGS. 7A–C show examples of controllable transconductance inverting amplifiers. FIG. 7A shows a simple inverter 150 that includes N-type FET (NFET) 152 and P-type FET (PFET) 154. The source of the NFET 152 is connected to a low or negative supply voltage, e.g., ground, $V_{low}$ or $V_{ss}$. The source of the PFET 154 is connected to a high or positive supply voltage, $V_{hi}$ or $V_{dd}$. The drain of the NFET 152 is connected to the drain of PFET 154 at the inverter output 156. The input to the inverter is connected to the common connection of the gate of NFET 152 and the gate of PFET 154. Transconductance of this inverter 150 may be varied by varying supply voltages and, in particular, $V_{dd}$.

For using the simple inverter 150 of FIG. 7A as a transconductance amplifier for small signals, the output current is given by:

$$I = \frac{(u \times c_0)_p}{2} \times \frac{z_p \times k}{l} \times (V_{in} - V_{DD} + V_t)^2 - \frac{(u \times c_0)_n}{2} \times \frac{z_n}{l} \times (V_{in} - V_t)^2$$

Where k is the ratio of the mobility-oxide capacitance product between the PFET 154 and NFET 152. Normalizing these products as:

$$\frac{(u \times c_0)_p}{2} \times \frac{z_p \times k}{l} = \frac{(u \times c_0)_n}{2} \times \frac{z_n}{l} = \frac{(u \times c_0)}{2} \times \frac{z}{l}$$

The transconductance gain of the inverter 150 is given by:

$$gm = \frac{(u \times c_0)}{2} \times \frac{z}{l} \times (-V_{DD} + 2V_t)$$

Thus, the transconductance gain of the inverter 150 is linearly proportional to the normalized width to length ratio of the inverter devices 152, 154. Care must be taken that the topology restriction ($gm_2/gm_1$)#2 is not violated to avoid saturating the VCO's output at the rail voltages ($V_{dd}$ and $V_{ss}$). This is accomplished by selecting different device sizes for the $gm_1$ and $gm_2$ inverters, sizing devices in the $gm_2$ inverters twice as large (i.e., twice as wide or half as long) as the $gm_1$ inverters and fixing the supply voltage for the $gm_1$ inverters at $V_{dd}$. Then, by limiting the supply voltage of the $gm_2$ inverters to the rail voltage or below, the resulting VCO will be stable. The output impedance that each of the inverters see is the parasitic capacitance at the output in parallel with the inverter output conductances as described by:

$$Z(s) = \frac{1}{(g_n + g_p) + sC}$$

So, for this example, four of the inverters 132', 134', 136' and 138', have a gm fixed at $gm_1$, while the remaining 4 inverters 132'', 134'', 136'' and 138'' have a variable gm of $gm_2$, controlled by adjusting their supply voltage. Using the simple inverter 150 for the $gm_2$ inverters 132'', 134'', 136'', 138'', connected between $V_{hi}$ and $V_{lo}$ has both an advantage and a disadvantage. The advantage is that the VCO output voltage swing remains large, i.e., full range to the supply voltage levels, provided the $gm_2$ inverter gain does not over drive the output signal. The disadvantage is that, particularly at low frequencies, the large signal swing at the output of the $gm_2$ inverter is out of phase with the signal at the input of the $gm_1$ inverter. When the source (control) voltage $V_{hi}$ for the PFET 154 of the $gm_2$ inverter is below $V_{dd}$, the output from the $gm_1$ inverter can exceed $V_{hi}$ such that current from the output signal flows into the $gm_2$ inverter output and from drain to source of PFET 154, clamping the output voltage. To avoid this, the minimum supply voltage for the $gm_1$ inverter must be limited. Another drawback of using this simple inverter 150 for the quadrature VCO is that the control voltage is also the supply voltage. Therefore, the control voltage must also be able to supply oscillator current because it is, essentially, the oscillator power supply. This can be resolved by replacing the $gm_2$ inverters 132'', 134'', 136'' and 138'' with the inverters 160 of FIG. 7B.

FIG. 7B shows a second controllable transconductance inverting amplifier 160, similar to that of FIG. 7A, includes NFET 162 and PFET 164 corresponding to NFET 152 and PFET 154. In addition, PFET 166 is connected drain to source in series with PFET 164, between the source of PFET 164 and high supply voltage $V_{dd}$. The gate of PFET 166 is controlled by a bias control voltage $V_{CON}$. For this controllable transconductance inverting amplifier 160, supply voltages may be held constant and transconductance may be varied by varying the current of PFET 166, i.e., by varying $V_{CON}$. The voltage at the source of PFET 164 is a function of the current supplied by PFET 166 and, correspondingly, the bias control voltage $V_{CON}$ at the gate of PFET 166.

The above described low frequency limitation can be overcome with switchable capacitors (not shown) at the summing nodes of each functional block. Since the phase shift of each summing node is a function of the total capacitance at that node, increasing the capacitance causes the phase shift to occur at a lower frequency and therefore reduces the oscillation frequency.

FIG. 7C shows a third controllable transconductance inverting amplifier 170. NFET 172 corresponds to NFETS 152, 162. The controllable transconductance inverting amplifier 170 of FIG. 7C is similar to the controllable transconductance inverting amplifier 160 of FIG. 7B with each of the series PFETs 164, 166 replaced by a parallel PFET pair. PFET 164 corresponds to parallel PFETs 174, 176 and PFET 166 corresponds to parallel PFETs 178, 180. PFETs 174, 178 are connected in series between $V_{dd}$ and the output. PFETs 176, 180 are also connected in series between $V_{dd}$ and the output transconductance controlled by two separate transconductance control bias voltages $V_{CON1}$ and $V_{CON2}$ connected to the gates of PFETs 178, 180 respectively. Optionally, the connection point between PFETs 174 and 178 may be connected to the connection point 182 between PFETs 176 and 180. With that optional connection, PFETs 174 and 176 may be replaced by a single PFET (not shown).

The multiple control voltage, controllable transconductance inverting amplifier 170 of FIG. 7C is useful for applications where multi-port steering control of the VCO is desired. As described hereinabove, the gm of the particular inverter is a function of device sizes in combination with supply voltages which produce the resulting inverter current. From the above oscillator analysis, using superposition and the current vectors of parallel PFETs 174, 176 and 178, 180, the effective transconductance can be found by summing individual transconductances of the parallel devices. By maintaining the effective device size ratio of parallel PFETs 174, 176 and PFETs 178, 180 identical to that of PFETs 164, 166 of inverter 160:

$$Z_{p166} = Z_{p178} + Z_{p180}$$

Thus, by controlling the device size ratio of PFETs 174, 176 to PFETs 178, 180, the relative sensitivity of each port is controlled. Additional sensitivity control is available by selectively connecting the common drain/source connection of PFETs 174, 178 to PFETs 176, 180 at 182.

It should be noted that for the above described embodiments, while each phase driver's quadrature output will vary virtually from 0 to infinity, oscillator topology places restrictions on the frequency range of the quadrature VCO. These frequency range restrictions are more apparent from more rigorous mathematical analysis of the VCO. The normalized, frequency-dependent transfer function of each functional block, input vectors and output vectors being described in exponential form, is:

$$V_{(n+2)}\left(e^{-j\left(\frac{2\pi(n+2)}{N}\right)}\right) = V_{(n)}\left(e^{-j\left(\frac{2\pi}{N}\right)}\right)(gm_{(n)}(|z(\omega)|e^{-jLL(\omega)})) +$$
$$V_{(n+1)}\left(e^{-j\left(\frac{2\pi(n+1)}{N}\right)}\right)(gm_{(n+1)}(|z(\omega)|e^{-jLL(\omega)}))$$

Where N is the number of oscillator phases and n=1,2,3,...N.

For the above described preferred quadrature oscillator N=4 and the required phase shift is B/2 radians. Since all of the functional blocks are identical, the case where n=1 is described. The phase requirement can be reduced to:

$$-\frac{\pi}{2} = -a\tan\left(\frac{gm_1}{gm_2}\right) + \angle Z(\omega_0)$$

The ArcTangent term $$\left(a\tan\left(\frac{gm_1}{gm_2}\right)\right)$$

is the phase shift associated with the variation in the gm's and the second term ($\angle Z(\omega_0)$) is the phase shift associated with the summing impedance pole. The latter phase shift is found to be:

$$\angle Z(\omega_0) = a\tan(-\omega RC)$$

Substituting, the frequency which satisfies the conditions of oscillation is where:

$$\omega_0 = \omega_c \times \left(\frac{gm_2}{gm_1}\right) \text{ where } \omega_c = \frac{1}{RC}$$

and so, $$\frac{\omega_0}{\omega_c} = \frac{gm_2}{gm_1}.$$

For a quadrature oscillator, input and output voltage vectors are all of equal amplitude, and gain requirements can be determined from:

$$1 \leq ((gm_1)^2 + (gm_2)^2) \times |Z(\omega_0)|^2$$

Thus, in terms of the corner summing impedance frequency:

$$1 \leq ((gm_1)^2 + (gm_2)^2) \times R^2 \times \left(\frac{1}{(\omega_0/\omega_c)^2 + 1}\right)$$

Then, using the above gm ratio to frequency ratio identity, the requirement for oscillation is given by:

$$1 \leq gm_1 \times R \text{ and}$$

$$\omega_0 = \frac{gm_2}{C}$$

Next analyzing the oscillator loop, the transfer function for each basic functional block input is:

$$H(s) = gm_{(n)}(|Z(S)|e^{-j(\angle L(s))}) = gm_{(n)} \times \left(\frac{R}{\frac{s}{\omega_c}+1}\right)$$

The sole difference between the two block inputs are $gm_1$ and $gm_2$, which are described by the ratio $M=gm_2/gm_1$. The transfer function of the block may be described in terms of the general transfer function H(s), the quadrature inputs I(s) and Q(s) and their complements. Thus, the oscillator function may be described in terms of the 4 simultaneous equations:

$$I(s)=-H(s)\times(\overline{I(s)}+M\times\overline{Q(s)})$$

$$Q(s)=-H(s)\times(\overline{Q(s)}+M\times I(s))$$

$$\overline{I(s)}=-H(s)\times(I(s)+M\times Q(s))$$

$$\overline{Q(s)}=-H(s)\times(Q(s)+M\times\overline{I(s)})$$

The output mode transfer function may be determined by injecting an input signal, X(s) at the complement of Q(s) to obtain:

$$\frac{I(s)}{X(s)} = \frac{-MH^1(s)(M^2H^3(s)-H^2(s)+1)}{H^4(s)(1-M^4)+4M^2H^3(s)-2H^2(s)+1}$$

Substituting H(s) above and solving, the transfer function poles are given by:

$$s=\omega_c(gm_{(n)}R\times(M-1)-1)$$

$$s=-\omega_c(gm_{(n)}R\times(M+1)+1)$$

$$s=\omega_c((gm_{(n)}R-1)+(\pm j)Mgm_{(n)}R)$$

So, from the gain requirement for stable oscillation, $1=gm_1R$, the poles determined hereinabove occur at:

$$s=\omega_c(M-2)$$

$$s=-\omega_c(M+2)$$

$$s=\omega_c((\pm j)M)$$

An additional restriction arises from the preferred topology as a simple real pole exists in the right half s-plane when $(gm_2/gm_1)>2$. To avoid the instability of having the poles in the right half s-plane the restriction $gm_2/gm_1$, #2 must be met which limits the upper oscillation frequency to 2/RC.

The Q of the preferred quadrature VCO may be determined from the open loop 3 dB bandwidth. So, considering the topology of the VCO 100 of FIG. 1 as a 2-stage differential circuit with feedback, the above quadrature equations, I(s) and $\overline{I(s)}$ can be used to determine the open loop transfer function for each stage.

Taking Q(s) and its complement ($\overline{Q(s)}$) as differential inputs and I(s) and its compliment ($\overline{I(s)}$) as outputs the transfer function for a single stage is:

$$\frac{I(s)-\overline{I(s)}}{Q(s)-\overline{Q(s)}} = \frac{M\times H(s)}{(1-H(s))}$$

Substituting H(s) from above the equation becomes:

$$\frac{I(s)-\overline{I(s)}}{Q(s)-\overline{Q(s)}} = \frac{(\omega_c gm_2 R)}{(s+\omega_c(1-gm_1 R))}$$

So, the open loop transfer function for 2 cascaded differential blocks is:

$$OL(s) = \frac{(\omega_c gm_2 R)^2}{(s^2+s(2\omega_c(1-gm_1 R))+(\omega_c(1-gm_1 R))^2)}$$

Thus, the Q of the quadratic in the denominator is ½ when $gm_1R>1$. However this is not particularly informative as the natural frequency is not the frequency of the VCO. When $gm_1R=1$, the circuit essentially is a pair of cascaded integrators of the form:

$$OL(s) = \left(\frac{1}{s}\times\frac{gm_2}{C}\right)^2$$

By cross coupling and feeding the differential output to the input, the circuit oscillates at the unity gain frequency, in this case $gm_2/C$ radians.

FIGS. 8A–D are simple schematic examples of multiple phase voltage control oscillators, representing 4, 5, 6 and 9 phases, respectively. In particular, the four phase VCO 130 of FIG. 8A corresponds directly to quadrature VCO 130 of FIG. 6. Individual transconductance amplifiers are represented by arrowheads 190, and each may be inverting or non-inverting, depending upon the particular application. Further, cross-coupled transconductance amplifiers are represented by double headed arrows 192 and other, individual transconductance amplifiers are represented by single headed arrows 194. It should be noted that for a VCO providing an even number of phases as in FIGS. 8A and 8C, cross-coupled transconductance amplifiers are included; whereas, for a VCO providing an odd number of phases as in the examples of FIGS. 8B and 8D, cross-coupled transconductance amplifiers are not included.

As can be seen from FIGS. 8A–D, the VCO structure becomes more complicated as the number of oscillator phases increases. Further, it is possible that more than one configuration may be available that each yield a particular number of phases.

In general, each phase driver drives one of the N phases, the phases being separated by 360°/N. These phases can be assigned values of k for k=0 to N−1, where $t_0$ is assigned a value of 0° and $$\emptyset_k = \frac{k}{N}\times 360°.$$

Figure 8A:
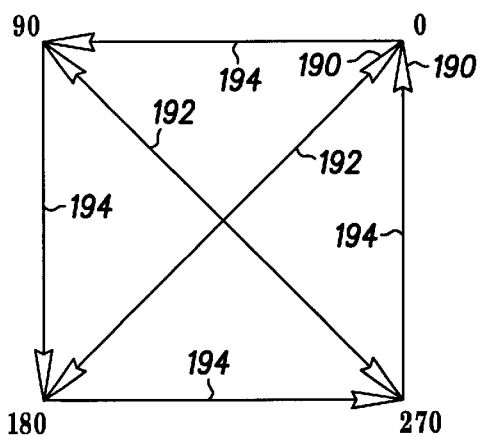
FIGS. 8A–D show simple schematic examples of multiple phase voltage control oscillators, representing 4, 5, 6 and 9 phases, respectively.
Figure 8B:
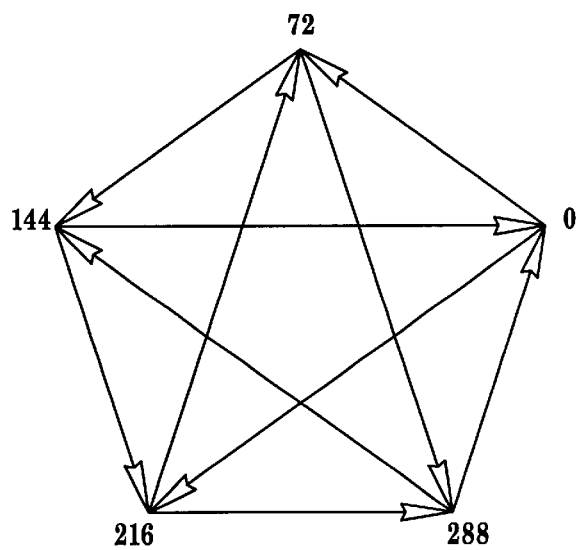
Figure 8C:
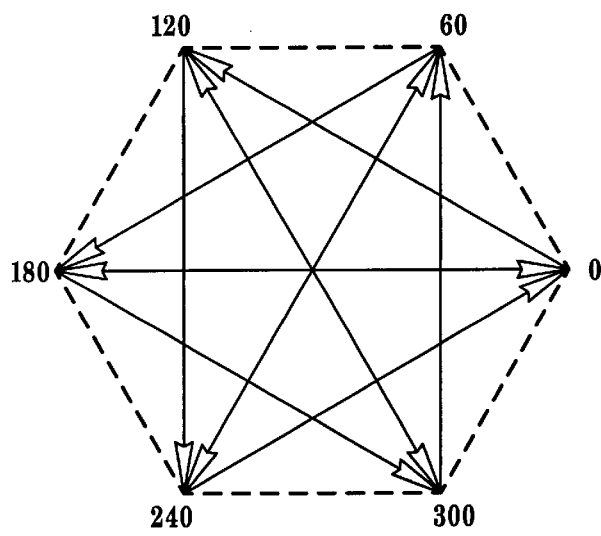
Figure 8D:
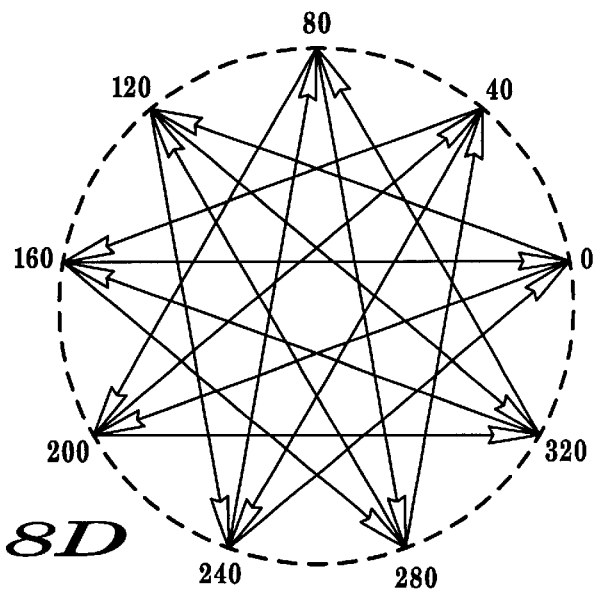

Thus, the phase driver input/output space is the set {0, 1, . . . , N−1} and designating the possible values for the phase driver inputs x and y, x and y are constrained to solutions of $$M=x+y \text{ Mod } N \text{ and } 0<M<$$

for phase driver output k=0. The phase shift due to the summing impedance is $$2_N = -\frac{M}{2N} \times 360°,$$

e.g., −45 degrees in the 4 phase oscillator example of FIGS. 6 and 8A and −36 degrees in the 5 phase oscillator example of FIG. 8B. Phase drivers may be either inverting or non-inverting transconductance amplifiers. Thus, for any phase driver output k, the corresponding inputs are:

x+k Mod N and y+k Mod N.

Advantageously, the preferred embodiment oscillator does not require an inductor and, therefore, does not have a conventional tuned circuit Q. The circuit Q may be described by the simple definition that Q equals stored energy divided by the dissipated energy for the passive elements, i.e. R and C. For a parallel RC circuit $Q=T_0RC$. $T_0=M/RC$ and, so, Q=M or the transconductance ratio of the inverter.

While the invention has been described in terms of preferred embodiments, those skilled in the art will recognize that the invention can be practiced with modification within the spirit and scope of the appended claims.

We claim:

1. A voltage controlled oscillator (VCO) providing a plurality of phases of the same oscillator frequency, said VCO comprising a plurality of phase drivers each driving an oscillator phase, each phase driver being voltage controllable and receiving at least two oscillator phases,
    wherein said VCO is a quadrature VCO and includes two pair of cross coupled phase drivers, each of said phase drivers of each said pair receiving a phase from said other pair of cross coupled phase drivers, each received said phase being ninety degrees out-of-phase with the corresponding phase driver output,
    wherein each of said phase drivers comprises at least two independently controllable transconductance amplifiers, each of said controllable transconductance amplifiers receiving a control voltage and an input phase and generating an output therefrom responsive to said control voltage to said input phase, said output from both of said at least two independently controllable transconductance amplifiers being connected together and driving an oscillator phase at an output of said phase driver.

2. A VCO as in claim 1, wherein a plurality of independently controllable transconductance amplifiers are pairs of inverters, transconductance of said inverters being adjusted by said control voltage.

3. A VCO as in claim 2, wherein each of said independently controllable transconductance amplifiers comprises:
    a first transistor of a first conduction type connected between an inverter output and a low supply voltage;
    a second transistor of a second conduction type connected between a high supply voltage ($V_{hi}$) and said inverter output; and
    a control gate of said first transistor connected to a control gate of said second transistor at an inverter input.

4. A VCO as in claim 3 wherein said control voltage is $V_{hi}$ for at least one of said independently controllable transconductance amplifiers.

5. A VCO as in claim 3 wherein said first and second transistors are field effect transistors (FETs), said first conduction type is N-type (NFET) and said second conduction type is P-type (PFET).

6. A VCO as in claim 3, wherein at least one of said independently controllable transconductance amplifiers further comprises:
    a third transistor of said second conduction type connected between $V_{hi}$ and said second transistor; and
    a control voltage connected to a control gate of said third transistor.

7. A voltage controlled oscillator (VCO) providing a plurality of phases of the same oscillator frequency, said VCO comprising a plurality of phase drivers each driving an oscillator phase, each phase driver being voltage controllable and receiving at least two oscillator phases,
    wherein each of said phase drivers comprises at least two independent controllable transconductance amplifiers, each of said controllable transconductance amplifiers receiving a control voltage and an input phase and generating an output from both of said at least two independently controllable transconductance amplifiers being connected together and driving an oscillator phase at an output of said phase driver,
    further wherein a plurality of independently controllable transconductance amplifiers are pairs of inverters, transconductance of said inverters being adjusted by said control voltage,
    still further wherein each of said independently controllable transconductance amplifiers comprises:
        a first transistor of a first conduction type connected between an inverter output and a low supply voltage;
        a second transistor of a second conduction type connected between a high supply voltage ($V_{hi}$) and said inverter output;
        a control gate of said first transistor connected to a control gate of said second transistor at an inverter output, and
    still further wherein each of said independently controllable transconductance amplifiers further comprises:
        a third transistor of second conduction type connected between ($V_i$) and said second transistor; and
        a control voltage connected to a control gate of said third transistor, and
        a fourth and fifth transistor of said second conduction type connected in series and between said high supply voltage and said inverter output;
        a second control voltage connected to a control terminal of said fifth transistor; and
        an input phase being connected to a control gate of each of said first transistor, said second transistor and said fourth transistor at said inverter input.

8. A voltage controlled oscillator (VCO) providing a plurality of oscillator phases, said VCO comprising a plurality of controllable transconductance inverting amplifiers each receiving an oscillator phase, each said oscillator phase being driven by at least two controllable transconductance inverting amplifiers,
    wherein said VCO is a quadrature VCO and includes two pair of cross coupled and two pairs of series connected controllable transconductance inverting amplifiers, each series connected pair connected between outputs of a corresponding one of said cross coupled pairs, each output of said cross coupled pairs being connected between another series connected pair,
    wherein each of the pairs of controllable transconductance inverting amplifiers are inverters, transconductance of said inverters being controllable by adjusting a supply voltage of pairs of said inverters.

9. A quadrature VCO as in claim 8, wherein each of said controllable transconductance inverting amplifiers comprises:

a first transistor of a first conduction type connected between an output and a low supply voltage ($V_{low}$); and a second transistor of a second conduction type connected between a high supply voltage ($V_{hi}$) and said output.

10. A quadrature VCO as in claim 9 wherein said first and second transistors are field effect transistors (FETs), said first conduction type is N-type (NFET) and said second conduction type is P-type (PFET).

11. A quadrature VCO as in claim 10 wherein $V_{hi}$ is adjusted for half of said controllable transconductance inverting amplifiers.

12. A quadrature VCO as in claim 10, wherein each of said second transistors is a first PFET and wherein at least two of said pairs of controllable transconductance inverting amplifiers further comprises:

a second PFET connected between $V_{hi}$ and said first PFET; and a control voltage being provided to a control gate of said second PFET.

13. A quadrature VCO as in claim 12, wherein said at least two of said pairs of controllable transconductance inverting amplifiers further comprises:

a third PFET and a fourth PFET connected in series and between $V_{hi}$ and said output;

a second control voltage connected to a control gate of said fourth PFET; and an input phase connected to a control gate of said first transistor, said first PFET and said third PFET.

14. A quadrature VCO comprising:

a first pair of voltage controllable transconductance inverting amplifiers cross coupled and providing a first pair of complementary outputs;

a second pair of voltage controllable transconductance inverting amplifiers cross-coupled and providing a second pair of complementary outputs, said second pair of complementary outputs being ninety degrees out of phase with said first pair of complementary outputs;

a third pair of voltage controllable transconductance inverting amplifiers connected in series between outputs of said first pair, an output of said second pair connected between said third pair; and a fourth pair of voltage controllable transconductance inverting amplifiers connected in series between outputs of said second pair, an output of said first pair being connected between said fourth pair, transconductance of amplifiers in said first and second pair being controlled by a first control voltage and transconductance of amplifiers in said third and fourth pair being controlled by a second control voltage.

15. A quadrature VCO as in claim 14, wherein at least two pair of controllable transconductance inverting amplifiers are pairs of inverters, transconductance of said pairs of inverters controlled by adjusting an inverter supply voltage.

16. A quadrature VCO as in claim 15, each of said controllable transconductance inverting amplifiers comprising:

a first field effect transistor (FET) connected between a high supply voltage $V_{hi}$ and an inverter output, said first FET being a p-type FET (PFET); and an n-type FET (NFET) connected between a low supply voltage and said inverter output.

17. A quadrature VCO as in claim 15, wherein at least two pair of said controllable transconductance inverting amplifiers further comprises:

a second PFET connected between $V_{hi}$ and said first PFET; and a transconductance control voltage being provided to a control gate of said second PFET.

18. A quadrature VCO as in claim 17, wherein said at least two pair of controllable transconductance inverting amplifiers further comprises:

a third and fourth PFET connected in series and between $V_{hi}$ and said output;

a second control voltage of being connected to a control gate of said fourth PFET; and an input phase being connected to a control gate of said NFET, said first PFET and said third PFET.

* * * * *